US006754878B1

United States Patent
Stentz et al.

(10) Patent No.: US 6,754,878 B1
(45) Date of Patent: Jun. 22, 2004

(54) RECOGNIZING STRUCTURE INFORMATION FROM A NETLIST

(75) Inventors: Guenter Stentz, Campbell, CA (US); James L. Saunders, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/402,444

(22) Filed: Mar. 27, 2003

(51) Int. Cl.$^7$ .............................................. G06F 17/50
(52) U.S. Cl. ...................... 716/7; 716/1; 716/2; 716/9; 716/10; 716/17; 716/18; 703/14; 703/22; 703/23
(58) Field of Search ............................ 716/1, 8, 10, 11, 716/12, 16, 18; 717/156, 159; 714/741, 738, 33; 709/226; 707/6; 703/23, 22, 14; 700/171; 345/440

(56) References Cited

U.S. PATENT DOCUMENTS

| | | | | |
|---|---|---|---|---|
| 5,377,201 A | * | 12/1994 | Chakradhar et al. ........ | 714/741 |
| 5,491,640 A | * | 2/1996 | Sharma et al. ................ | 716/18 |
| 5,521,836 A | * | 5/1996 | Hartoog et al. ............... | 716/10 |
| 5,586,020 A | * | 12/1996 | Isozaki ....................... | 717/159 |
| 5,659,716 A | * | 8/1997 | Selvidge et al. .............. | 703/23 |
| 5,841,663 A | * | 11/1998 | Sharma et al. ................ | 716/18 |
| 6,099,577 A | * | 8/2000 | Isobe ............................ | 716/2 |
| 6,148,433 A | * | 11/2000 | Chowdhary et al. ........... | 716/1 |
| 6,195,786 B1 | * | 2/2001 | Raghunathan et al. ......... | 716/2 |
| 6,298,472 B1 | * | 10/2001 | Phillips et al. ................ | 716/18 |
| 6,442,743 B1 | * | 8/2002 | Sarrafzadeh et al. .......... | 716/10 |
| 6,651,235 B2 | * | 11/2003 | Dai et al. ...................... | 716/7 |

OTHER PUBLICATIONS

NNRD408184, "PHSDL packaging high structure design language", Apr. 1, 1998, vol. No.: 41, Issue No.: 408.*
Harmanani et l., "An improved method for RTL synthesis with testability tradeoffs", Nov. 1993, IEEE/ACM International Conference, Digest of technical papers, pp.: 30–35.*
Tafertsholler et al., INGRAINE–an implication graph–based engine for fast implication, justification and propagation, Aug. 2000, IEEE Transaction, vol.: 19, Issue: 8, pp.: 907–927.*

* cited by examiner

Primary Examiner—Vuthe Siek
Assistant Examiner—Yelena Rossoshek
(74) Attorney, Agent, or Firm—LeRoy D. Maunu

(57) ABSTRACT

Method and apparatus for recognizing data path structures in a netlist. The stages in the netlist are identified. Each stage includes a set of components that process multiple bits. The buses that connect the stages are also identified. A graph is generated to represent the stages and buses. The vertices in the graph represent the stages and the edges represent the buses. The graph is divided into subgraphs having terminating vertices that represent memory elements. Each subgraph represents a data path structure.

26 Claims, 7 Drawing Sheets

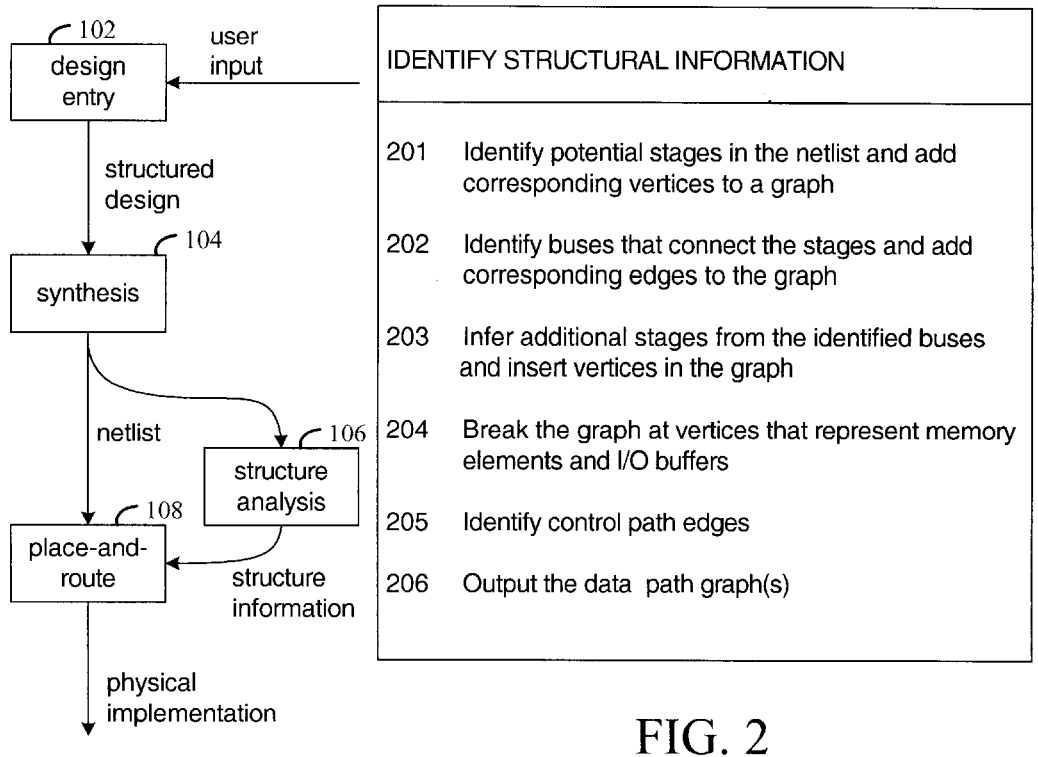

IDENTIFY STRUCTURAL INFORMATION

201  Identify potential stages in the netlist and add corresponding vertices to a graph 202  Identify buses that connect the stages and add corresponding edges to the graph 203  Infer additional stages from the identified buses and insert vertices in the graph 204  Break the graph at vertices that represent memory elements and I/O buffers 205  Identify control path edges 206  Output the data path graph(s)

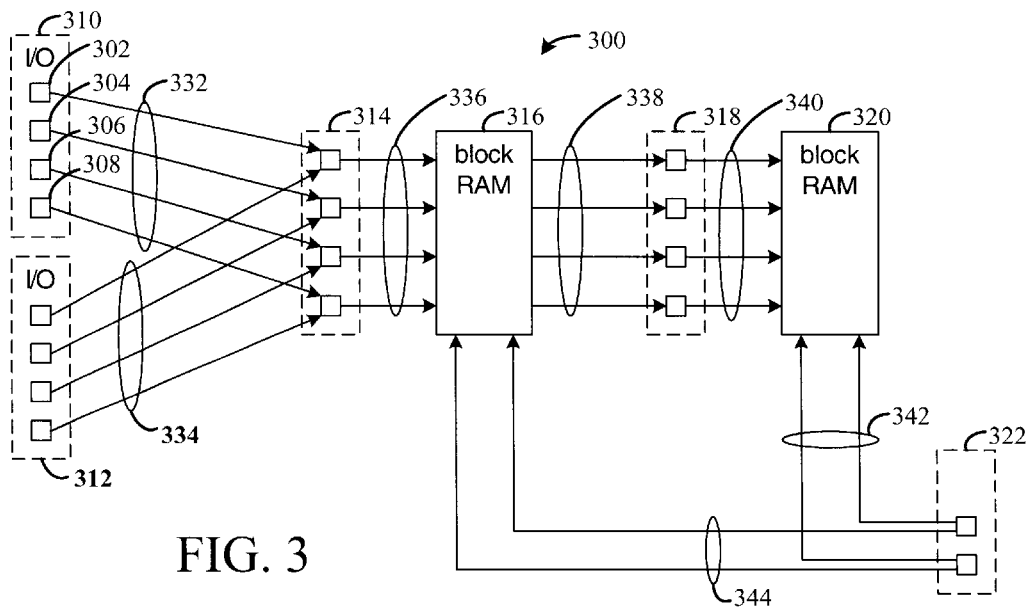

FIG. 3

| | 600 |
|---|---|
| INFER ADDITIONAL STAGES (edge $e_i = (v_l, v_m)$) | |
| 601 | IF (all $k$ paths represented by edge $e_i$ pass the same number of $p$ logic levels) |
| 602 | Make vector $V$ empty |
| 603 | FOR $q = 1..p$ |
| 604 | $C$ = set of $k$ components that are $q$ logic levels away from $S_l$ along the $k$ paths |
| 605 | IF (components in $C$ are part of the same stage $S_C$) |
| 606 | Append stage $S_C$ to vector $V$ |
| 607 | ELSE IF (components in vector $C$ are not part of any stage yet) |
| 608 | Create new stage $S_C$ for components in vector $C$ and append $S_C$ to vector $V$ |
| 609 | IF $V$ is not empty |
| 610 | Remove edge $e_i = (v_l, v_m)$ |
| 611 | Insert edge $(v_l, V[0])$ |
| 612 | FOR all $i = 1..length[V] -2$ |
| 613 | Insert edge $(V[i], V[i+1])$ |
| 614 | Insert edge $(V[length[V]-1], v_m)$ |
| 615 | RETURN |

FIG. 6

RECOGNIZING STRUCTURE INFORMATION FROM A NETLIST

FIELD OF THE INVENTION

The present invention generally relates to recognizing structure information in netlists.

BACKGROUND

The design process for creating a circuit design typically includes phases of design entry, synthesis, and physical implementation. The physical implementation phase further breaks down into technology mapping and placing and routing ("place-and-route"). At different stages in the design process the design is simulated to verify functional correctness and to verify that timing constraints are met.

Various design tools are used to functionally specify the design in the design entry phase, for example, schematic capture and HDL-based tools. At this design level the design is usually highly structured from a functional standpoint. The structure information is generally not carried forward in the output of synthesis tools. A synthesis tool generates a netlist that embodies the design specified in design entry, the netlist specifying components of the design and connectivity between the components.

The physical implementation tools process the netlist to produce design data suitable for building or configuring a particular device, for example, an ASIC or an FPGA. Because structure information is typically unavailable during physical implementation, the physical implementation tools may rely on heuristics, thereby creating problems in finding an optimal implementation. Some of the structure information might be helpful in effectively placing and routing the design.

A method and an apparatus that address the aforementioned problems, as well as other related problems, are therefore desirable.

SUMMARY OF THE INVENTION

The present invention in various embodiments provides for recognition of data path structures in a netlist. The stages in the netlist are identified. Each stage includes a set of components that process multiple bits. The buses that connect the stages are also identified. A graph is generated to represent the stages and buses. The vertices in the graph represent the stages and the edges represent the buses. The graph is divided into subgraphs having terminating vertices that represent memory elements. Each subgraph represents a data path structure.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIG. 1 illustrates a design flow and arrangement for creating an electronic circuit design in accordance with various embodiments of the invention;

FIG. 2 illustrates a process for extracting structural information from a netlist in accordance with various embodiments of the invention;

FIG. 3 is a schematic view of an example netlist from which structural information is extracted according to various embodiments of the invention;

FIG. 6 illustrates a process by which additional stages in the netlist may be inferred;

DETAILED DESCRIPTION

Figure 4A:
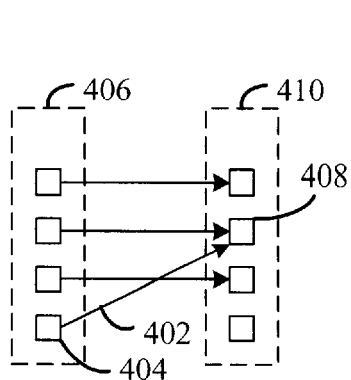
FIG. 4A illustrates a schematic view of an example crossing path.

The present invention in various embodiments provides for recognition of data path structures in a netlist. A graph is generated in which the vertices represent stages in the netlist and the edges represent buses that connect the stages. A stage includes a set of components that process the bits of one or multiple buses in parallel. The graph is partitioned into subgraphs, with memory elements or I/O buffers being the vertices at which the graph is partitioned. After identifying the control paths, the subgraphs may be separately considered for suitable placement of data path structures and control path structures represented by the subgraphs.

FIG. 1 illustrates an arrangement of a design flow for creating an electronic circuit design in accordance with various embodiments of the invention. A user enters a circuit design via design entry tool 102. The design entry tool may be, for example, either a schematic capture tool or a tool suited to enter HDL code. The circuit design may be specified in a structured manner for purposes of functional verification and enhancement. Structured designs are common in many signal processing applications. In these applications, words of data are read into a chip and are processed, for example, added, multiplied, multiplexed, or shifted, in order to generate the appropriate data for output. The structural relationship of the various operations may be useful in generating of placement of the logic.

The circuit design is then processed by synthesis tool 104. The synthesis tool transforms the input design specification into a netlist, which specifies the components of the design and the connectivity (signals) between the components. Oftentimes, the resulting netlist is flat, that is the netlist does not contain any structure information.

Even though the netlist may be void of structure information, underlying structures of the design may be derived from the netlist. The structure analysis tool 106 analyzes the netlist for this implicit structure information. In one embodiment, the structure analysis tool is a stand-alone tool and provides the derived structure information as input to the place-and-route tool 108. In another embodiment, the structure analysis tool is integrated with the place-and-route tool.

The place-and-route tool generates physical implementation data based on the input netlist and derived structure information. The implementation data specify specific resources that must be built or configured on the target device in order to implement the circuit design. The place-and-route tool may use the derived structure information to generate an improved placement as will be seen in the example of FIG. 3. Those skilled in the art will appreciate that various alternative computing arrangements would be suitable for hosting the processes of the different embodiments of the present invention. In addition, the processes may be provided via a variety of computer-readable media or delivery channels such as magnetic or optical disks or tapes, electronic storage devices, or as application services over a network.

FIG. 2 illustrates a process 200 for extracting structural information from a netlist in accordance with various embodiments of the invention, and FIG. 3 is a schematic view of an example netlist 300 from which structural information is extracted according to various embodiments of the invention. The example netlist is referenced repeatedly in the remainder of this description to illustrate operations of the various embodiments of the invention.

The example structural information sought by process 200 includes data paths. A data path is a part of a design in which bit-wise data operations are performed in parallel on multiple bits. A data path includes buses and stages. A bus is a set of wires that transport the bits of a word of data, and a stage is a set of components that process the individual bits of one or more buses in parallel. Examples of components include I/O buffers, processing components (e.g., slices in an FPGA), and memory elements such as registers or block RAMS in an FPGA.

The netlist 300 of FIG. 3 illustrates components, stages, and buses. The stages and buses are discussed in the example of FIG. 3 before proceeding with the process of FIG. 2 for the purpose of illustrating the structural information being sought in a netlist. It should be understood that neither the stages nor the buses are explicitly identified as such in the netlist, and identifying these structures is one of the tasks involved in identifying the structural information of the netlist.

Each of blocks 302, 304, 306, and 308 represents an I/O buffer component, and together the blocks represent a stage 310. Stage 312 also encompasses a set of I/O buffer components. Stage 314 includes a set of components, such as slices of an FPGA; stage 316 includes a block RAM memory element; stage 318 includes another set of slice components; and stage 320 includes a block RAM memory element. Stage 322 includes register components that are used to drive the address pins of the block RAMS of stages 316 and 320. The buses in the example netlist include bus 332, 334, 336, 338, 340, 342, and 344. By identifying structural characteristics of a design, the elements of the design may be placed in a manner that minimizes the skew between signals on a bus and potentially improves timing characteristics. For example, the components of the stages may be placed with the buses running from left to right in parallel routing resources.

Returning now to the process of FIG. 2, the process begins by identifying potential stages in the netlist and representing the stages as vertices in a graph (step 201). In the example embodiment, a directed graph is used to represent the data paths and control paths derived form the netlist. The graph G is specified as G=(V, E), where each vertex $v_i \in V$ represents a stage, and each edge $e_i \in E$ represents a bus.

The direction of an edge represents the direction in which a signal flows. A visual presentation of this information may be useful to designers seeking to manually floorplan a design or interact with physical design tools.

A stage is specified by an ordered set of components $\{c_0, \ldots, c_{n-1}\}$, with i in $c_i$ designating the index of a component within the stage. In an example design for an FPGA, components of a stage are typically designed to be placed in a column or row of the FPGA, and the indices of the components determine the order in the column or row.

A netlist typically does not contain structural information about data paths. However, the stages may be identified by way of particular device resources used by components or by the particular names assigned to components either by the designer or by the synthesis tool. For example, carry chains may be recognized by usage of resources such as carry-in and carry-out pins, and block RAM, multipliers, and macros are named as such. In one embodiment, stages are identified by searching the netlist for such occurrences. In an example netlist targeted to an FPGA, the process searches for memory elements such as block RAMS, carry chains and multipliers, and relatively placed macros. A data path often stores the result of an operation in block RAM, and another data path may read data from the block RAM. Carry chains and multipliers are typically used for processing data within data paths. Relatively placed macros may be used to specify relative placement of a set of components. Relatively placed macros are often used by designers to provide hints to the placement tools. For example, a relatively placed macro may specify vertical alignment of the components that are part of a data path stage.

I/O components may also be identified as stages by way of naming conventions. For example, the signals of an I/O bus may have names such as bus[0], bus[1], ..., bus[n−1]. This naming convention is used in many synthesis tools. Stages consisting of register components may be identified in a similar manner.

The potential stages identified in the example of FIG. 3 are stages 310, 312, 316, 320, and 322. Note that stages 314 and 318 were not identified by the methods of this step. These stages are identified in step 203. At this phase of the process, the identified stages are considered potential stages because later phases may find them not to be part of a data path.

After the potential stages are identified, the connectivity between the stages is analyzed to identify the buses and add the buses to the graph as edges (step 202). For each of the stages, a breadth-first search of the netlist is performed beginning at the output pins of the components that are part of a particular stage and searching in the direction of the signal flow. The search stops at components that are elements of other stages. To save processing time, the search also stops after a selected number of levels have been processed, for example, 5 levels.

If w paths are found that begin at stage $S_i$ and end at stage $S_j$, the paths are considered to be a bus if the following conditions are met:

$w >= w_{min}$, that is, a collection of paths is considered to be a bus if the number of paths, w, is at least a selected minimum width; and $c <= c_{max}$, where c denotes a percentage of crossing paths (a crossing path is illustrated in FIG. 4A);

when two stages have a high percentage of crossing paths, the collection of paths is less likely to constitute a bus.

Figure 4B:
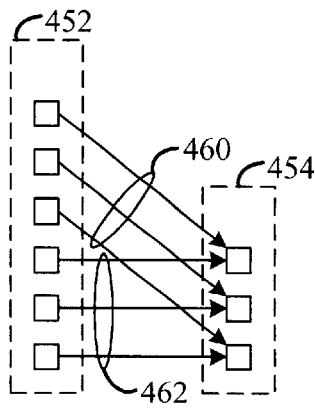
FIGS. 4B and 4C illustrate schematic views of example sub-buses.
Figure 4C:
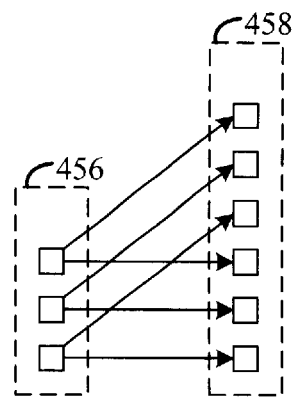

FIG. 4A illustrates a schematic view of an example crossing path. A path from a component having an index m of stage $S_i$ to a component of index n in stage $S_j$ is a crossing path if there is another path from a component of index k of stage $S_i$ to component l of stage $S_j$ where m>=k and n<=l. Path 402 flows from component 404 (m=3) of stage 406 to component 408 (n=1) of stage 410 (k=2, and l=2). When two stages have a high percentage of crossing paths, the paths are less likely to constitute a bus. FIGS. 4B and 4C illustrate two exceptions.

FIGS. 4B and 4C illustrate schematic views of example sub-buses. In both of these figures, two stages are connected by a set of w paths. Stage 452 is connected to stage 454 (FIG. 4B), and stage 456 is connected to stage 458 (FIG. 4C). The paths will not be identified as a single bus because the percentage of crossing paths is high. However, it is clear that the w paths can be divided into two subsets each of them free of crossing paths. Each of the two subsets of paths will be considered a bus and represented as an edge in the graph. For example, the subset 460 is considered a bus, and subset 462 is considered as another bus.

Figure 5:
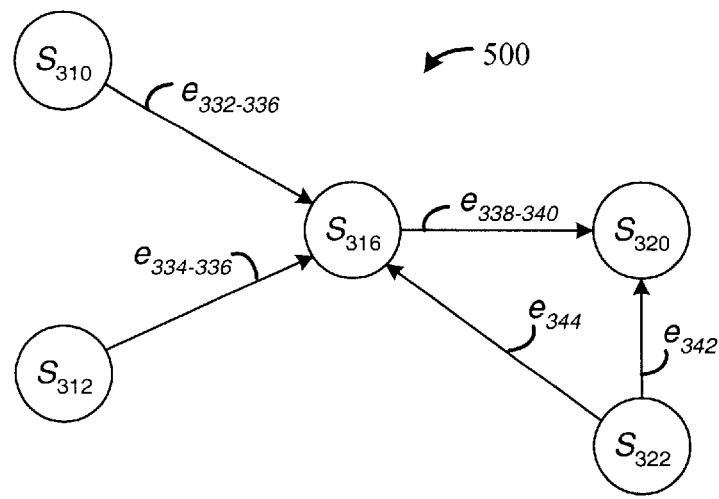
FIG. 5 illustrates an example graph generated from the netlist of FIG. 3.

FIG. 5 illustrates a graph 500 generated from the example netlist of FIG. 3 by the steps of identifying stages and buses. The vertices are labeled $S_{310}$, $S_{312}$, $S_{316}$, $S_{320}$, and $S_{322}$ to correspond to the stages marked in FIG. 3 and detected as potential stages in process step 201. The edges are labeled $e_{332\text{-}336}$, $e_{334\text{-}336}$, $e_{338\text{-}340}$, $e_{342}$, and $e_{344}$ to correspond to the buses marked in FIG. 3 and paths detected as buses in process step 202. For this example $w_{min}$ has been set to 2 for identifying buses. Note that stages 314 and 318 have not been initially detected.

The next phase of the process is to infer additional stages based on the buses that have been identified (step 203).

FIG. 6 illustrates a process by which additional stages in the netlist may be inferred. The additional stages are inferred by analyzing the connectivity of the buses identified in step 202. Assume paths are found from k components in stage $S_i$ to components in stage $S_j$ and the paths satisfy the requirements of a bus. Also assume that each of these paths pass through p components that are not part of any other stages from $S_i$ to $S_j$; in other words each path passes through an equal number of components between $S_i$ and $S_j$. The objective of this part of the process is to try to form additional stages between $S_i$ and $S_j$.

For example, edge $e_{332\text{-}336}$ in FIG. 5 represents the 4 paths between stage $S_{310}$ and stage $S_{316}$. Each of the 4 paths passes through one component between stage $S_{310}$ and stage $S_{316}$ where the components are not part of any stage. These 4 components are grouped and identified as stage 314 (FIG. 3) and represented as vertex $S_{314}$ in FIG. 7.

Process 600 loops through all edges $e_i$ of a graph. Edge $e_i$ represents k paths that begin at k components in stage $S_l$ and end at components in stage $S_m$. Process 600 attempts to infer additional stages from this edge if all k paths represented by this edge pass through the same number of (p>0) logic levels (excluding the start and end vertex of the path) (line 601). For each such edge, lines 602–614 of the process are performed. The vector V is first emptied (line 602). Vector V is used to collect the stages found through edge $e_i$. The loop of lines 603–608 investigates whether additional stages can be found along the k paths represented by edge $e_i$. Each pass in this loop processes one of the p logic levels. Line 604 determines the vector C that contains the k components that are q logic levels away from stage $S_l$ (represented by vertex $v_l$) along the k paths. More specifically, the j'th component in this vector will be the q'th component along the j'th path where the paths are ordered with respect to the indices of the start component in stage $S_l$. If the components in vector C are all part of the same stage $S_{c'}$ and $S_c$ already exists, the stage $S_c$ is appended to vector V (line 606). Otherwise, if none of the components in vector C are yet part of a stage, the components are grouped together in vector C in a new stage $S_{c'}$ and $S_c$ is appended to the vector V (line 608).

If additional stages have been found through edge $e_i$, which means that the vector V is not empty (line 609), the original edge $e_i$ is removed and replaced with (length [V]+1) edges, where length[V] is the number of stages in vector V. These new edges chain together the start vertex $v_l$ of edge $e_i$, the vertices corresponding to the stages in the vector V in the order in which the vertices appear in the vector, and the end vertex $v_m$ of edge $e_i$ (lines 611–614). The process returns to the process of FIG. 2 when complete.

As an extension to the process of inferring additional stages, all new edges that are created may be checked for bus properties. If an edge does not fulfill the bus properties, the edge is not inserted into the graph. In addition, if the edge starts and/or ends at a vertex that was newly created in line 608 of the process, the vertex is also deleted.

Figure 7:
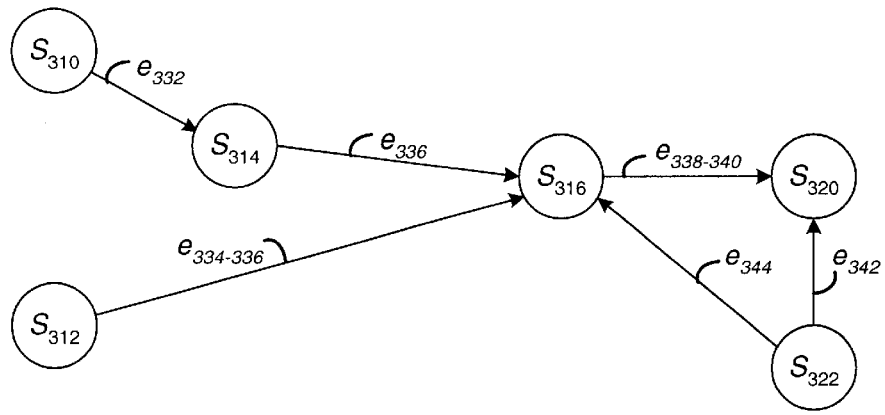
FIG. 7 illustrates a graph in which a stage has been inferred from the example netlist illustrated in FIG. 3.

FIG. 7 illustrates a graph in which stage $S_{314}$ has been inferred from the example netlist illustrated in FIG. 3. After processing edge $e_{332\text{-}336}$ of FIG. 5, vertex $S_{314}$ has been inserted to represent stage 314 (FIG. 3). Also, edge $e_{332\text{-}336}$ is replaced with edge $e_{332}$ from vertex $S_{310}$ to vertex $S_{314}$ and edge $e_{336}$ from vertex $S_{314}$ to vertex $S_{316}$. The process continues with processing the paths in the netlist that are represented by the other edges of the graph 500 (FIG. 5).

Figure 8:
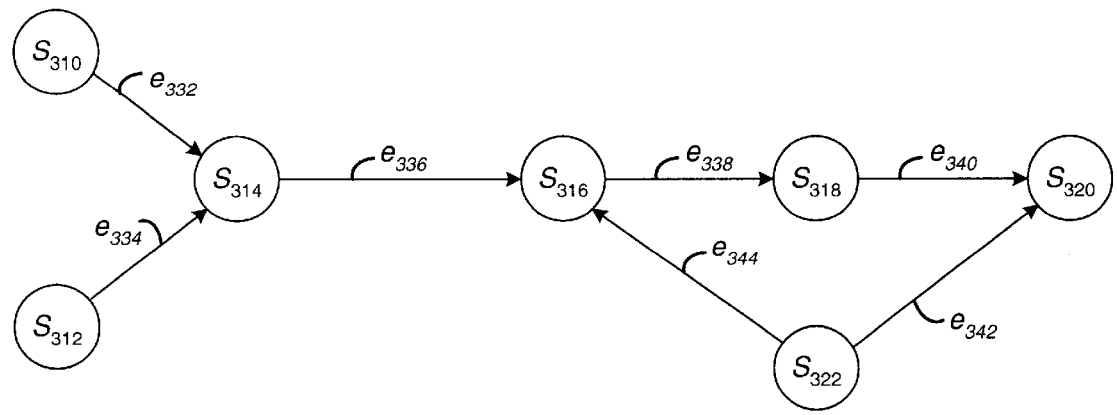
FIG. 8 illustrates a graph after application of the process for inferring stages has completed processing of the example netlist illustrated in FIG. 3.

FIG. 8 illustrates a graph after application of the process for inferring stages has completed processing of the all the edges of the graph 500 (FIG. 5). Edge $e_{334}$ replaces edge $e_{334\text{-}336}$, vertex $S_{318}$ is added to represent stage 318, and edges $e_{338}$ and $e_{340}$ replace edge $e_{338\text{-}340}$.

Figure 9:
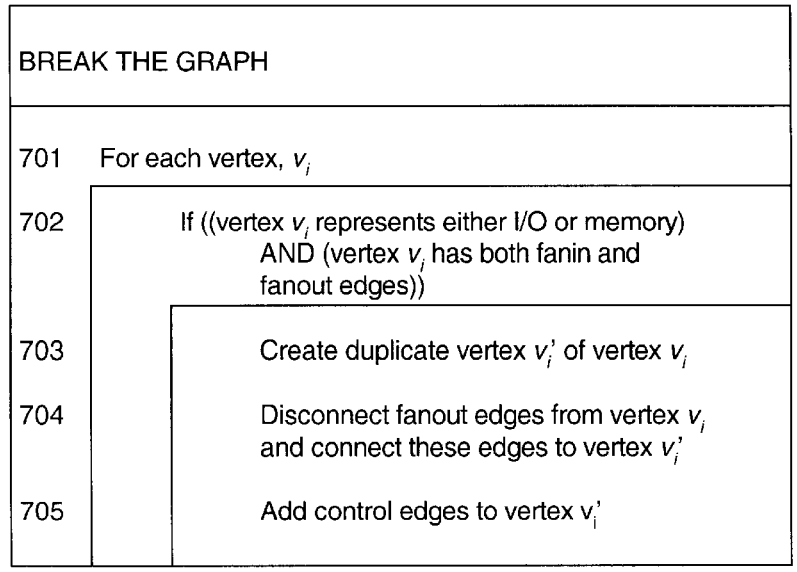
FIG. 9 illustrates a process for breaking a graph built from a netlist.

Returning now to the process of FIG. 2, after inferring additional stages, the graph is broken at vertices that represent memory elements or I/O buffers (step 204). FIG. 9 illustrates a process for breaking the graph built thus far. The process checks each vertex in the graph (step 701). If a vertex $v_i$ represents either a memory element or an I/O buffer, and the vertex $v_i$ has both fan-in and fan-out edges (step 702), the process creates a duplicate vertex $v_{i'}$ (step 703). The fan-out edges from $v_i$ are reconnected as fan-out edges from $v_{i'}$ (step 704). For control edges that are connected to $v_{i'}$ corresponding new control edges are added to connect to $v_{i'}$ (step 705).

Figure 10:
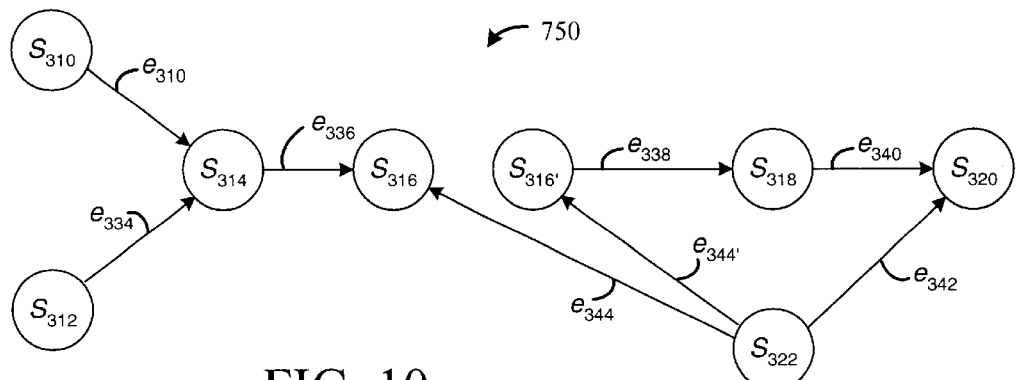
FIG. 10 illustrates a graph of the example netlist from FIG. 3 having been broken according to the process of FIG. 9.

FIG. 10 illustrates a graph 750 of the example netlist from FIG. 3 in which the graph has been broken according to the process of FIG. 9. There are no longer edges from vertex $S_{316}$ to vertex $S_{318}$. The new vertex $S_{316'}$ has been added, and fan-out edge $e_{338}$, which was formerly a fan-out edge from $S_{316}$, has been reconnected as a fan-out edge from $S_{316'}$ to $S_{318}$. A new control edge $e_{344'}$ has been added from vertex $S_{322}$ to vertex $S_{316'}$.

Returning now to the process of FIG. 2, after the graph has been broken, the edges that are part of control paths are identified (step 205). In FIG. 10 it can be seen that even though the graph has been split, the control path that includes edges $e_{342}$, $e_{344}$, $e_{344'}$ from vertex $S_{322}$ connects the two data paths (one data path includes vertices $S_{310}$, $S_{312}$, $S_{314}$, and $S_{316}$, and the other data path includes vertices $S_{316'}$, $S_{318}$, and $S_{320}$)

Figure 11:
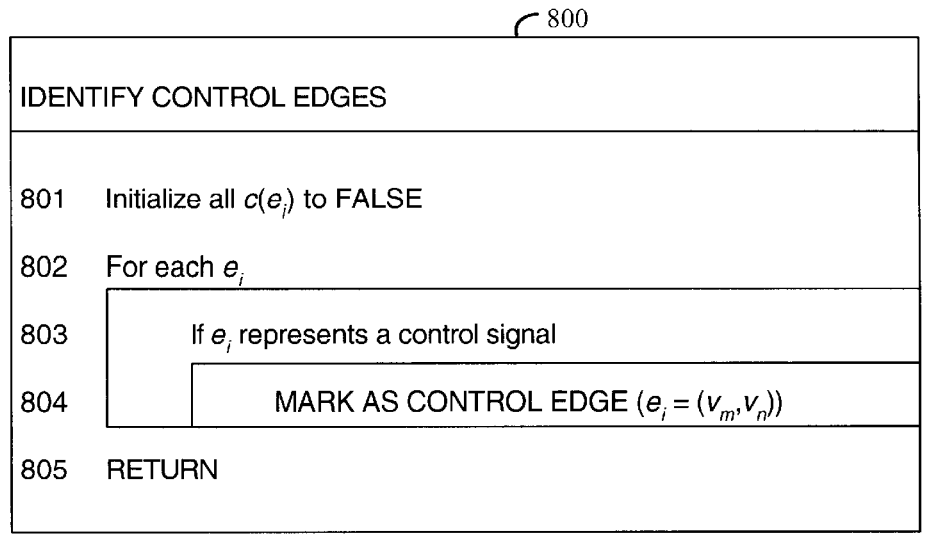
FIG. 11 illustrates an example process for identifying control edges in a graph.

FIG. 11 illustrates an example process for identifying control edges in a graph. The process establishes a Boolean value, $c(e_i)$, for every edge in the graph. The value is TRUE if $e_i$ is part of the control path. Otherwise the value is FALSE. Process 800 begins by initializing $c(e_i)$ to FALSE for every edge in the graph (step 801).

The process then loops through every edge in the graph (step 802). If an edge $e_i$ represents a control signal (step 803), another process, denoted MARK AS CONTROL EDGE (see FIG. 12), is called with $e_i$ as the input parameter (step 804). Control signals may be identified by being connected to the control input pins of components. Examples of control input pins are address pins of RAM components or selector pins of multiplexers. The edge $e_i$ is denoted by the pair of vertices $v_m$ and $v_n$. Control is returned to the process of FIG. 2 after all the edges have been processed.

Figure 12:
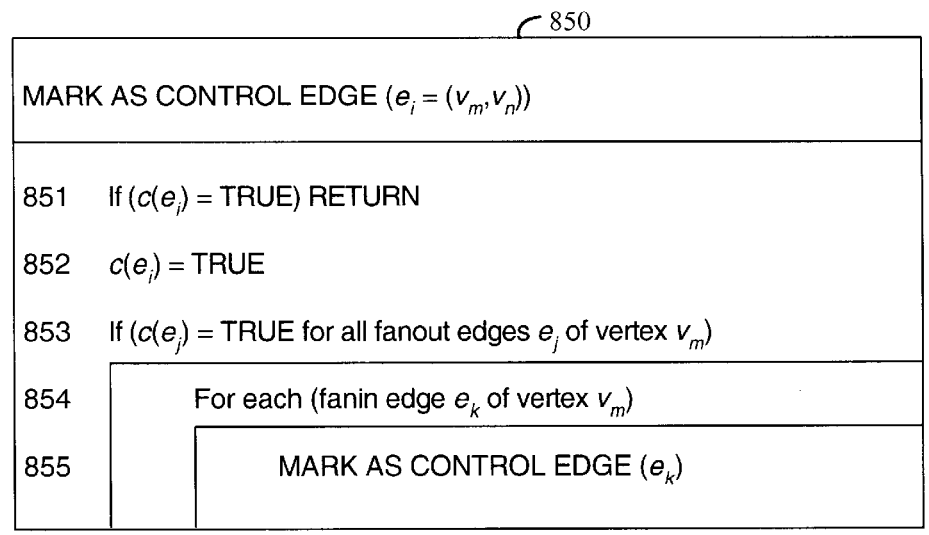
FIG. 12 illustrates a process for marking control edges identified in the process of FIG. 11.

FIG. 12 illustrates a process 850 for marking control edges identified in the process of FIG. 11. If the input edge $e_i$ is already marked as a control edge, then the process returns to process 800 (step 851). Otherwise, the $c(e_i)$ is assigned the value TRUE (step 852).

If all fan-out edges $e_j$ of vertex $v_m$ are part of a control path ($c(e_j)$=TRUE, step 853), then the process 850 is recursively invoked (step 855) for each fan-in edge $e_k$ of vertex $v_m$ (step 854).

Figures 13A, 13B:
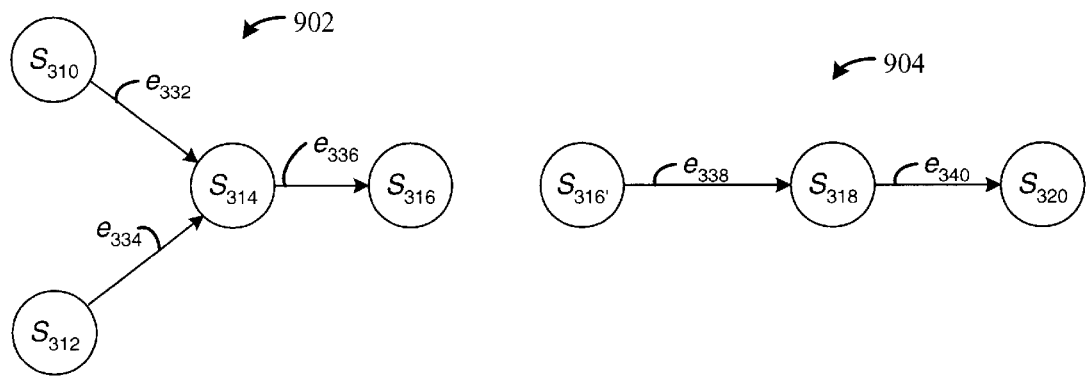
FIGS. 13A and 13B illustrate the subgraphs of the data paths that remain after identifying the control path in the graph of FIG. 10.
Figure 13C:
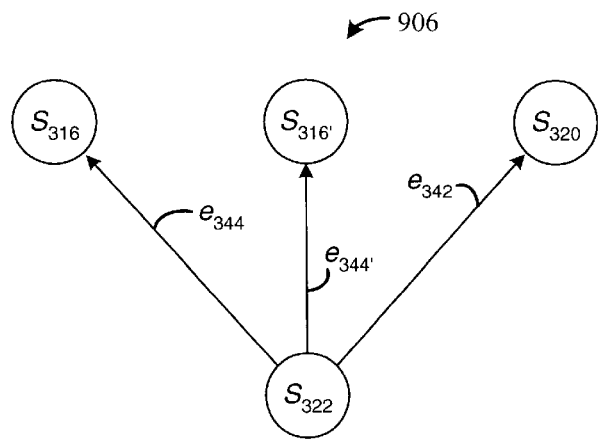
FIG. 13C illustrates the subgraph of the control path.

Returning now to the process of FIG. 2, once the edges of the control path have been identified and marked, the data flow graphs and control flow graphs may be output (step 206). FIGS. 13A and 13B illustrate the data subgraphs 902 and 904, respectively, that are formed after the control edges are identified or recognized and removed from the graph of FIG. 10. The subgraphs illustrate structure information that may be used in laying out the design. FIG. 13C illustrates a graph 906 of the control path.

The present invention is believed to be applicable to a variety of tools for placing electronic circuit designs on various types of circuit devices and has been found to be particularly applicable and beneficial in placing designs on FPGAS. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for recognizing data path structures in a netlist, comprising:

recognizing stages in the netlist, each stage including a set of components that process multiple bits;

recognizing buses that connect the stages;

generating a graph that represents the stages and buses, the graph having vertices representing the stages and edges representing the buses; and dividing the graph into subgraphs having terminating vertices that represent memory elements, the subgraphs representing data path structures.

2. The method of claim 1, further comprising:

recognizing edges and vertices associated with control signals; and removing from the graph the edges and vertices associated with control signals.

3. The method of claim 2, wherein a data flow graph remains after removal of the edges and vertices associated with control signals.

4. The method of claim 3, further comprising generating one or more control flow graphs from the edges and vertices associated with control signals.

5. The method of claim 1, further comprising outputting data that illustrate the subgraphs.

6. The method of claim 1, wherein recognizing stages in the netlist comprises recognizing names of components in the netlist.

7. The method of claim 6, wherein the set of selected names includes names of memory elements.

8. The method of claim 6, wherein the set of selected names includes names of multipliers.

9. The method of claim 6, wherein the set of selected names includes names of relatively placed macros.

10. The method of claim 6, wherein recognizing stages in the netlist comprises recognizing usage of selected hardware resources.

11. The method of claim 1, wherein recognizing buses further comprises:

searching for names of signals that match names in a set of selected names; and establishing the buses as a function of signal names matching the selected names and similarity between signal names.

12. The method of claim 11, wherein a collection of paths is recognized as a bus if the number of paths, w, is at least a selected minimum width.

13. The method of claim 12, wherein a collection of paths from components in a first set to components in a second set is recognized as a bus if a percentage of paths that cross paths is less than or equal to a selected threshold value.

14. The method of claim 1, further comprising inserting an additional stage in the graph between a first stage and a second stage in the graph if each path from the first stage to the second stage passes through an equal number of components between the first stage and the second stage.

15. A computer-implemented method for recognizing data path structures in a netlist, comprising:

recognizing stages in the netlist, each stage including a set of components that process multiple bits;

recognizing buses that connect the stages;

generating a graph that represents the stages and buses, the graph having vertices representing the stages and edges representing the buses;

recognizing edges and vertices associated with control signals;

removing from the graph the edges and vertices associated with control signals;

inserting an additional stage in the graph between a first stage and a second stage in the graph if each path from the first stage to the second stage passes through an equal number of components between the first stage and the second stage;

dividing the graph into subgraphs having terminating vertices that represent memory elements, the subgraphs representing data path structures; and outputting data that illustrate the subgraphs.

16. The method of claim 15, wherein recognizing stages in the netlist comprises recognizing names of components in the netlist.

17. The method of claim 16, wherein the set of selected names includes names of memory elements.

18. The method of claim 16, wherein the set of selected names includes names of multipliers.

19. The method of claim 16, wherein the set of selected names includes names of relatively placed macros.

20. The method of claim 16, wherein recognizing stages in the netlist comprises recognizing usage of selected hardware resources.

21. The method of claim 15, wherein recognizing buses further comprises:

searching for names of signals that match names in a set of selected names; and establishing the buses as a function of signal names matching the selected names and similarity between signal names.

22. The method of claim 21, wherein a collection of paths is recognized as a bus if the number of paths, w, is at least a selected minimum width.

23. The method of claim 22, wherein a collection of paths from components in a first set to components in a second set is recognized as a bus if a percentage of paths that cross paths is less than or equal to a selected threshold value.

24. An apparatus for recognizing data path structures in a netlist, comprising:
   means for recognizing stages in the netlist, each stage including a set of components that process multiple bits;
   means for recognizing buses that connect the stages;
   means for generating a graph that represents the stages and buses, the graph having vertices representing the stages and edges representing the buses; and
   means for dividing the graph into subgraphs having terminating vertices that represent memory elements, the subgraphs representing data path structures.

25. An article of manufacture for recognizing data path structures in a netlist, comprising:
   a computer-readable medium configured with instructions for causing a computer to perform the steps of,
      recognizing stages in the netlist, each stage including a set of components that process multiple bits;
      recognizing buses that connect the stages;
      generating a graph that represents the stages and buses, the graph having vertices representing the stages and edges representing the buses; and
      dividing the graph into subgraphs having terminating vertices that represent memory elements, the subgraphs representing data path structures.

26. An article of manufacture for recognizing data path structures in a netlist, comprising:
   a computer-readable medium configured with instructions for causing a computer to perform the steps of,
      recognizing stages in the netlist, each stage including a set of components that process multiple bits;
      recognizing buses that connect the stages;
      generating a graph that represents the stages and buses, the graph having vertices representing the stages and edges representing the buses;
      recognizing edges and vertices associated with control signals;
      removing from the graph the edges and vertices associated with control signals;
      inserting an additional stage in the graph between a first stage and a second stage in the graph if each path from the first stage to the second stage passes through an equal number of components between the first stage and the second stage;
      dividing the graph into subgraphs having terminating vertices that represent memory elements, the subgraphs representing data path structures; and
      outputting data that illustrate the subgraphs.

* * * * *

UNITED STATES PATENT AND TRADEMARK OFFICE
CERTIFICATE OF CORRECTION

PATENT NO.   : 6,754,878 B1  
DATED        : June 22, 2004  
INVENTOR(S)  : Guenter Stenz et al.

It is certified that error appears in the above-identified patent and that said Letters Patent is hereby corrected as shown below:

<u>Title page,</u>  
Item [75], Inventor, "Stentz" should read -- Stenz --

Signed and Sealed this

Twenty-first Day of June, 2005

JON W. DUDAS  
*Director of the United States Patent and Trademark Office*